United States Patent
Pritchett et al.

(10) Patent No.: US 7,280,335 B2
(45) Date of Patent: Oct. 9, 2007

(54) PROTECTION CIRCUIT AND METHOD FOR PROTECTING A SWITCH FROM A FAULT

(75) Inventors: Thomas E Pritchett, Kokomo, IN (US); Dale R. Sullivan, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 325 days.

(21) Appl. No.: 10/873,436

(22) Filed: Jun. 22, 2004

(65) Prior Publication Data

US 2005/0280967 A1    Dec. 22, 2005

(51) Int. Cl.
*H02H 9/02* (2006.01)

(52) U.S. Cl. .................... 361/93.9; 361/93.7
(58) Field of Classification Search ............ 361/18, 361/93.7–93.9
See application file for complete search history.

(56) References Cited

U.S. PATENT DOCUMENTS

| | | | | |
|---|---|---|---|---|
| 4,809,122 A | * | 2/1989 | Fitzner | ............ 361/18 |
| 5,091,664 A | * | 2/1992 | Furuhata | ............ 327/574 |
| 5,444,591 A | * | 8/1995 | Chokhawala et al. | ......... 361/18 |
| 6,538,480 B2 | * | 3/2003 | Takada et al. | ............ 327/108 |
| 7,012,792 B2 | * | 3/2006 | Yoshida | ............ 361/57 |
| 2003/0058593 A1 | * | 3/2003 | Bertele et al. | ............ 361/63 |

* cited by examiner

*Primary Examiner*—Michael Sherry
*Assistant Examiner*—Danny Nguyen
(74) *Attorney, Agent, or Firm*—Jimmy L. Funke

(57) ABSTRACT

A protection circuit for protecting a switch from a fault includes a first sensing circuit and a second sensing circuit. The first sensing circuit senses a low-side load current through a switch that includes a first terminal, a second terminal and a control terminal. The first terminal is connected to a low-side of the load and the second terminal is connected to ground. The switch provides a conductive path between the first and second terminals responsive to a control signal provided on the control terminal. The first sensing circuit acts to reduce a magnitude of the control signal to limit the low-side load current, carried by the switch, when the low-side load current exceeds a first predetermined value. The second sensing circuit senses a voltage at the low-side of the load and interrupts the low-side load current, when the voltage at the low-side of the load exceeds a second predetermined value.

17 Claims, 1 Drawing Sheet

PROTECTION CIRCUIT AND METHOD FOR PROTECTING A SWITCH FROM A FAULT

TECHNICAL FIELD

The present invention is generally directed to a protection circuit and, more specifically, a protection circuit for protecting a switch from a fault.

BACKGROUND OF THE INVENTION

Over-current and short circuit protection circuits for protecting drive outputs, e.g., low-side drive outputs, are generally expensive and have a relatively wide tolerance. Unfortunately, protection circuits that have a relatively wide tolerance may allow for excessive power dissipation in the output driver that they are to protect. In general, automotive applications require protection of each connector pin of an assembly from short-to-battery faults and short-to-ground faults. A variety of techniques have been utilized to protect various input/output (IO) pins of an electronic device from faults. These techniques have included implementing self-protected output drivers, operational amplifier circuits and individual transistor circuits. However, these techniques tend to be relatively expensive and may not provide acceptable accuracy to prevent an output driver from experiencing excessive power dissipation.

With reference to FIG. 1, an electrical schematic of a relevant portion of a low-side drive circuit 100, which includes a current limit circuit 110, is shown. The circuit 110 acts as a current limiter for a low-side drive output and turns on when a voltage across the resistor $R_{sense}$ exceeds the base-to-emitter voltage $V_{be}$ of transistor Q2. When the transistor Q2 turns on and the gate of transistor Q3 is pulled towards ground, the circuit 110 limits the current through the transistor Q3 (and the resistor $R_{sense}$) to maintain a voltage $V_{sense}$ (at the base of the transistor Q2) to approximate the base-to-emitter voltage $V_{be}$. Unfortunately, wide variations in the base-to-emitter voltage $V_{be}$ of the transistor Q2 with temperature causes a relatively wide variation in the current conducted by the transistor Q3.

Further, as the transistor Q2 operates the transistor Q3 in a linear mode, the transistor Q3 has a continuous relatively high power dissipation until a fault at the low-side of the load is removed. For example, assuming the resistor $R_{sense}$ is a 200 milliohm resistor, the voltage at the low-side of the load is 15 volts and that the base-to-emitter voltage $V_{be}$ of the transistor Q2 varies between 0.4 and 0.7 volts, the transistor Q3 is current limited between 2 and 3.5 Amperes. This leads to a power dissipation for the transistor Q3 of between 30 and 50 Watts. It should be appreciated that requiring the transistor Q3 to dissipate at this power level until the fault is removed may shorten the life of the transistor Q3. Additionally, in the event that the power dissipation of the transistor Q3 reaches too high of a level, the transistor Q3 may fail.

What is needed is a relatively low-cost protection circuit that exhibits acceptable accuracy and limits power dissipation of a switch to an acceptable level.

SUMMARY OF THE INVENTION

The present invention is directed to a protection circuit and method for protecting a switch from a fault. The method senses a low-side load current through the switch, which includes a first terminal, a second terminal and a control terminal. The first terminal is connected to a low-side of a load and the second terminal is connected to ground. The switch provides a conductive path between the first and second terminals responsive to a control signal provided on the control terminal. A magnitude of the control signal is reduced to limit the low-side load current carried by the switch when the low-side load current exceeds a first predetermined value. A voltage at the low-side of the load is sensed and the low-side load current is interrupted when the voltage at the low-side of the load exceeds a second predetermined value.

The method may be implemented by a protection circuit that includes a first sensing circuit and a second sensing circuit. The first sensing circuit senses a low-side load current through the switch, which, as described above, includes a first terminal, a second terminal and a control terminal. As discussed above, the first terminal is connected to a low-side of the load and the second terminal is connected to ground. The switch provides a conductive path between the first and second terminals responsive to a control signal provided on the control terminal. The first sensing circuit acts to reduce a magnitude of the control signal to limit the low-side load current carried by the switch, when the low-side load current exceeds a first predetermined value. The second sensing circuit senses a voltage at the low-side of the load and interrupts the low-side load current, when the voltage at the low-side of the load exceeds a second predetermined value.

According to another embodiment, the first sensing circuit further includes a sense resistor and a first transistor. The sense resistor is coupled between a second terminal of the switch and ground. The first transistor includes a first terminal, a second terminal and a control terminal. The sense resistor provides a first sense signal to the control terminal of the first transistor and the first terminal of the first transistor is coupled to the control terminal of the switch and the second terminal of the first transistor is coupled to ground. The first transistor pulls the control terminal of the switch toward ground to limit the low-side load current responsive to the first sense signal, when the first sense signal indicates that the low-side load current exceeds the first predetermined value, as set by the sense resistor.

According to another embodiment, the second sensing circuit further comprises a resistive biasing network and a second transistor. The resistive biasing network is coupled between the low-side of the load and ground. The second transistor includes a first terminal, a second terminal and a control terminal, with the first terminal of the second transistor coupled to the control terminal of the switch and the second terminal of the second transistor coupled to ground. At least a portion of the resistive biasing network provides a second sense signal to the control terminal of the second transistor, which pulls the control terminal of the switch to ground responsive to the second sense signal to interrupt the low-side load current, when the second sense signal indicates that the voltage at the low-side of the load exceeds the second predetermined value.

According to yet another embodiment, the resistive biasing network includes a voltage limiting device positioned to prevent excessive voltages from being applied to the control terminal of the second transistor. According to yet another embodiment, the switch is one of a metal-oxide semiconductor field-effect transistor (MOSFET) and an insulated-gate bipolar transistor (IGBT). The switch may also be a bipolar transistor or, broadly, any switch that is capable of operating in a linear mode.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
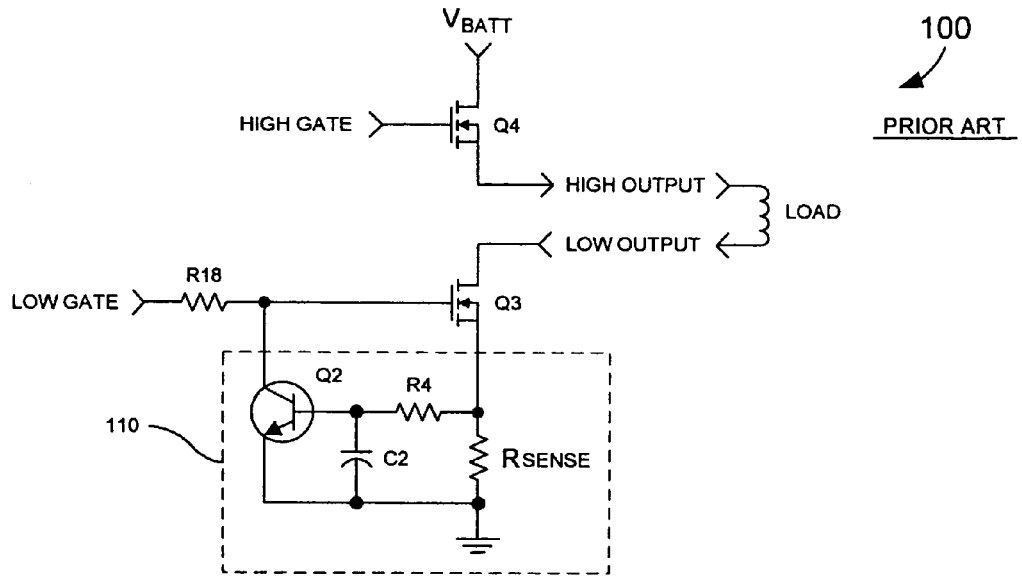
FIG. 1 is an electrical schematic of a low-side driver, including current limit protection, according to the prior art.
Figure 2:
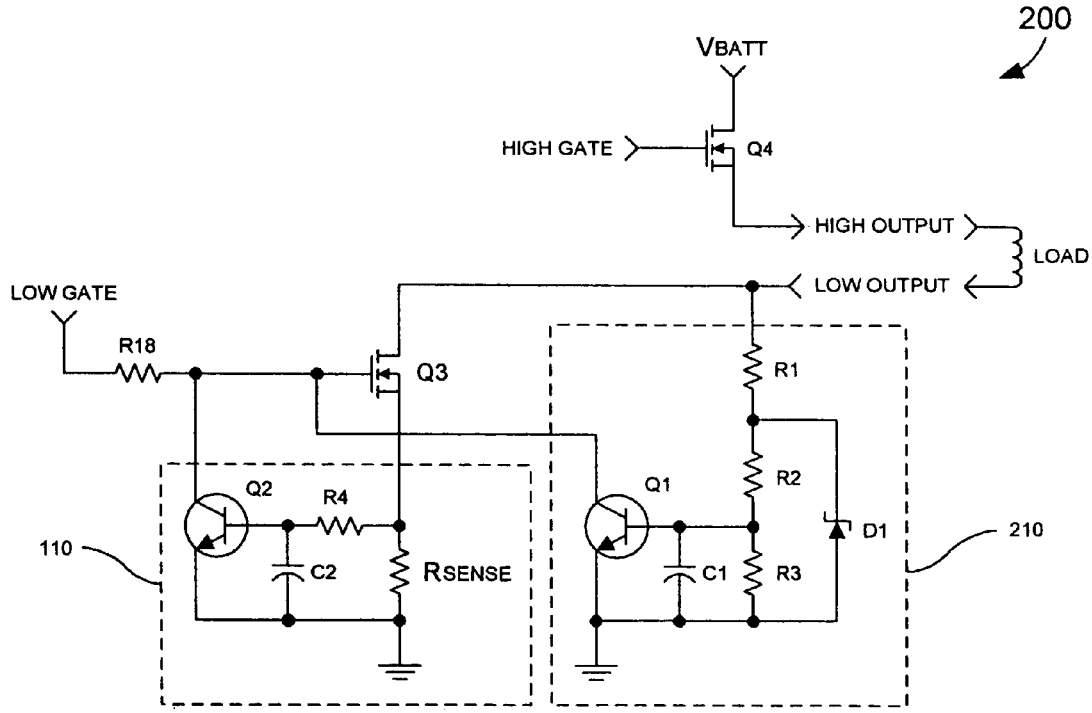
FIG. 2 is an electrical schematic of a low-side driver including a protection circuit constructed according to the present invention.

In a typical high-side driver configuration, a low-side driver is gated on by an external control device and the high-side driver is pulse width modulated to provide a current to the load. According to the present invention, a sensing circuit 210 is provided that triggers when a voltage at a low-side of the load exceeds a desired value. When the circuit 210 triggers, transistor Q1 turns on and pulls the gate of the transistor Q3 to ground. As previously discussed, the protection circuit 110 includes a transistor Q2, which is turned on by an overcurrent fault. When the transistor Q2 is turned on, the transistor Q2 pulls the gate of the transistor Q3 toward ground and, thus, causes the transistor Q3 to operate in a linear mode. When Q3 is operating in a linear mode, the voltage at the drain of the transistor Q3, or the low-side of the load, rises. As the voltage at the low-side of the load rises, the current is conducted by a resistive voltage divider, which includes resistors R1, R2 and R3. When the voltage across the resistor R3 is greater than the base-to-emitter voltage $V_{be}$ of the transistor Q1, the transistor Q1 turns on and conducts. When the transistor Q1 turns on, it shorts the gate of the transistor Q3 to ground and, thus, turns the transistor Q3 off. It should be appreciated that the voltage at the low-side of the load remains at a relatively high level and, providing the voltage at the low-side of the load remains above the base-to-emitter voltage $V_{be}$ of the transistor Q1, the transistor Q1 remains on and the transistor Q3 remains off. Alternatively, the transistor Q1 may be replaced with a comparator.

During an overfault condition, the circuit 210 is reset, i.e., the transistor Q1 turns off, when a signal provided at the gate of the transistor Q4 is no longer asserted. Assuming that the fault has been corrected, the transistor Q3 then operates in a normal mode. However, if the fault is still present, the transistor Q1 triggers again and pulls the gate of the transistor Q3 to ground, thus, turning off the transistor Q3. It should also be appreciated that during a short-to-battery fault at the low-side of the load, removal of the fault is required before the circuit 210 can reset.

Accordingly, a protected circuit has been described herein, which provides for an economical means for protecting a low-side current drive from fault conditions. It should be appreciated that the resistors R1, R2, R3, the zener diode D1, the transistor Q1 and the capacitor C1 can be implemented with relatively inexpensive surface mount components and, thus, provide an economical low-cost technique for protecting a low-side driver.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for protecting a switch from a fault, comprising the steps of:

sensing a low-side load current through the switch, wherein the switch includes a first terminal, a second terminal and a control terminal and the first terminal is connected to a low-side of a load and the second terminal is connected to ground, and wherein the switch provides a conductive path between the first and second terminals responsive to a control signal provided on the control terminal;

reducing a magnitude of the control signal to limit the low-side load current carried by the switch when the low-side load current exceeds a first predetermined value;

providing a resistive biasing network between the low-side of the load and ground;

providing a second sense signal developed across at least a portion of the resistive biasing network to a control terminal of a second transistor, the second transistor including a first terminal and a second terminal, wherein the first terminal of the second transistor is coupled to the control terminal of the switch and the second terminal of the second transistor is coupled to ground;

sensing a voltage at the low-side of the load; and pulling the control terminal of the switch to ground responsive to the second sense signal to interrupt the low-side load current when the second sense signal indicates that the voltage at the low-side of the load exceeds the second predetermined value.

2. The method of claim 1, further comprising the step of:

providing a sense resistor between the second terminal of the switch and ground;

providing a first sense signal developed across the sense resistor to a control terminal of a first transistor, the first transistor including a first terminal and a second terminal, wherein the first terminal of the first transistor is coupled to the control terminal of the switch and the second terminal of the first transistor is coupled to ground; and pulling the control terminal of the switch toward ground to limit the low-side load current responsive to the first sense signal when the first sense signal indicates that the low-side load current exceeds the first predetermined value.

3. The method of claim 2, wherein the first transistor is an NPN transistor.

4. The method of claim 2, wherein the first and second transistors are NPN transistors.

5. The method of claim 1, wherein the resistive biasing network includes a voltage limiting device positioned to prevent excessive voltages from being applied to the control terminal of the second transistor.

6. The method of claim 1, wherein the switch is one of a metal-oxide semiconductor field-effect transistor (MOSFET) and an insulated-gate bipolar transistor (IGBT).

7. A protection circuit for protecting a switch from a fault, the circuit comprising:

a first sensing circuit for sensing a low-side load current through the switch, wherein the switch includes a first terminal, a second terminal and a control terminal and the first terminal is connected to a low-side of a load and the second terminal is connected to ground, and wherein the switch provides a conductive path between the first and second terminals responsive to a control signal provided on the control terminal, where the first sensing circuit acts to reduce a magnitude of the control signal to limit the low-side load current carried by the switch when the low-side load current exceeds a first predetermined value; and a second sensing circuit for sensing a voltage at the low-side of the load, the second sensing circuit interrupting the low-side load current when the voltage at the low-side of the load exceeds a second predetermined value, wherein said second sensing circuit comprises a resistive biasing network coupled between the low-side of the load and ground, and wherein said second sensing circuit further comprises a second transistor including a first terminal, a second terminal and a control terminal, wherein the first terminal of the second transistor is coupled to the control terminal of the switch and the second terminal of the second transistor is coupled to ground, and wherein at least a portion of the resistive biasing network provides a second sense signal to the control terminal of the second transistor, and wherein the second transistor pulls the control terminal of the switch to ground responsive to the second sense signal to interrupt the low-side load current when the second sense signal indicates that the voltage at the low-side of the load exceeds the second predetermined value.

8. The protection circuit of claim 7, wherein the first sensing circuit further comprises:

a sense resistor coupled between the second terminal of the switch and ground; and a first transistor including a first terminal, a second terminal and a control terminal, wherein the sense resistor provides a first sense signal to the control terminal of the first transistor, and wherein the first terminal of the first transistor is coupled to the control terminal of the switch and the second terminal of the first transistor is coupled to ground, wherein the first transistor pulls the control terminal of the switch toward ground to limit the low-side load current responsive to the first sense signal when the first sense signal indicates that the low-side load current exceeds the first predetermined value.

9. The protection circuit of claim 8, wherein the first transistor is an NPN transistor.

10. The protection circuit of claim 8, wherein the first and second transistors are NPN transistors.

11. The protection circuit of claim 7, wherein the resistive biasing network includes a voltage limiting device positioned to prevent excessive voltages from being applied to the control terminal of the second transistor.

12. The protection circuit of claim 7, wherein the switch is one of a metal-oxide semiconductor field-effect transistor (MOSFET) and an insulated-gate bipolar transistor (IGBT).

13. A protection circuit for protecting a switch from a fault, the circuit comprising:

a first sensing circuit having a first transistor for sensing a low-side load current through the switch, wherein the switch includes a first terminal, a second terminal and a control terminal and the first terminal is connected to a low-side of a load and the second terminal is connected to ground, and wherein the switch provides a conductive path between the first and second terminals responsive to a control signal provided on the control terminal, where the first sensing circuit acts to reduce a magnitude of the control signal to limit the low-side load current carried by the switch when the low-side load current exceeds a first predetermined value; and a second sensing circuit for sensing a voltage at the low-side of the load, the second sensing circuit interrupting the low-side load current when the voltage at the low-side of the load exceeds a second predetermined value, wherein the switch is an insulated-gate bipolar transistor (IGBT), said second sensing circuit further comprising a resistive biasing network coupled between the low-sided of the load and ground, and a second transistor including a first terminal, a second terminal and a control terminal, wherein the first terminal of the second transistor is coupled to the control terminal of the switch and the second terminal of the second transistor is coupled to ground, and wherein at least a portion of the resistive biasing network provides a second sense signal to the control terminal of the second transistor, wherein the second transistor pulls the control terminal of the switch to ground responsive to the second sense signal to interrupt the low-side load current when the second sense signal indicates that the voltage at the low-side of the load exceeds the second predetermined value.

14. The protection circuit of claim 13, wherein the first sensing circuit further comprises:

a sense resistor coupled between the second terminal of the switch and ground; and the first transistor including a first terminal, a second terminal and a control terminal, wherein the sense resistor provides a first sense signal to the control terminal of the first transistor, and wherein the first terminal of the first transistor is coupled to the control terminal of the switch and the second terminal of the first transistor is coupled to ground, wherein the first transistor pulls the control terminal of the switch toward ground to limit the low-side load current responsive to the first sense signal when the first sense signal indicates that the low-side load current exceeds the first predetermined value.

15. The protection circuit of claim 14, wherein the first transistor is an NPN transistor.

16. The protection circuit of claim 13, wherein the first and second transistors are NPN transistors.

17. The protection circuit of claim 13, wherein the resistive biasing network includes a voltage limiting device positioned to prevent excessive voltages from being applied to the control terminal of the second transistor.

* * * * *